United States Patent
Chen et al.

(10) Patent No.: US 11,462,661 B2
(45) Date of Patent: Oct. 4, 2022

(54) MICRO LIGHT EMITTING DIODE CHIP AND MICRO LIGHT EMITTING DIODE WAFER

(71) Applicant: PlayNitride Display Co., Ltd., MiaoLi County (TW)

(72) Inventors: Yi-Ching Chen, MiaoLi County (TW); Yu-Chu Li, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 213 days.

(21) Appl. No.: 16/730,788

(22) Filed: Dec. 30, 2019

(65) Prior Publication Data
US 2021/0119080 A1    Apr. 22, 2021

(30) Foreign Application Priority Data
Oct. 22, 2019 (TW) ................................ 108138034

(51) Int. Cl.
| | |
|---|---|
| *H01L 33/22* | (2010.01) |
| *H01L 33/44* | (2010.01) |
| *H01L 27/15* | (2006.01) |
| *H01L 33/32* | (2010.01) |
| *H01L 33/38* | (2010.01) |
| *H01L 33/06* | (2010.01) |

(52) U.S. Cl.
CPC .............. *H01L 33/22* (2013.01); *H01L 27/15* (2013.01); *H01L 33/32* (2013.01); *H01L 33/38* (2013.01); *H01L 33/44* (2013.01); *H01L 33/06* (2013.01)

(58) Field of Classification Search
CPC ......... H01L 33/22; H01L 33/44; H01L 27/15; H01L 33/32; H01L 33/38; H01L 33/06; H01L 33/382; H01L 33/08; H01L 27/156
See application file for complete search history.

(56) References Cited

U.S. PATENT DOCUMENTS

2008/0079013 A1 * 4/2008 Li ........................... H01L 33/08
                                                    257/96
2008/0135864 A1   6/2008 David et al.
(Continued)

FOREIGN PATENT DOCUMENTS

| CN | 101026213 | 8/2007 |
|---|---|---|
| CN | 101859820 | 10/2010 |

(Continued)

OTHER PUBLICATIONS

"Office Action of China Counterpart Application", dated Mar. 29, 2021, p. 1-p. 9.
(Continued)

*Primary Examiner* — Su C Kim
(74) *Attorney, Agent, or Firm* — JCIPRNET

(57) ABSTRACT

A micro light emitting diode chip includes a light emitting layer, a first type semiconductor layer, and a second type semiconductor layer. The light emitting layer includes a metal element and a plurality of non-epitaxial media. The non-epitaxial media are separated from each other to disperse the metal element. A spacing between any two adjacent non-epitaxial media is less than 100 nanometers. The first type semiconductor layer is disposed on one side of the light emitting layer. The second type semiconductor layer is disposed on the other side of the light emitting layer.

9 Claims, 6 Drawing Sheets

(56) References Cited

U.S. PATENT DOCUMENTS

| | | | |
|---|---|---|---|
| 2008/0157056 A1 | 7/2008 | Yeh et al. | |
| 2008/0187768 A1* | 8/2008 | Kouvetakis | H01L 21/02535 |
| | | | 428/450 |
| 2012/0142133 A1* | 6/2012 | Tu | H01L 33/20 |
| | | | 438/42 |
| 2018/0231191 A1* | 8/2018 | Shchekin | H05B 45/24 |
| 2018/0332677 A1 | 11/2018 | Ku et al. | |
| 2019/0296188 A1 | 9/2019 | Lai et al. | |

FOREIGN PATENT DOCUMENTS

| | | |
|---|---|---|
| CN | 101960601 | 1/2011 |
| CN | 102187477 | 9/2011 |
| CN | 102222743 | 10/2011 |
| CN | 103782398 | 5/2014 |
| CN | 105405946 | 3/2016 |
| CN | 105932127 | 9/2016 |
| KR | 100845549 | 7/2008 |

OTHER PUBLICATIONS

"Office Action of China Counterpart Application", dated Jun. 30, 2020, p. 1-p. 9.

"Office Action of Taiwan Counterpart Application", dated Apr. 28, 2020, p. 1-p. 4.

* cited by examiner

MICRO LIGHT EMITTING DIODE CHIP AND MICRO LIGHT EMITTING DIODE WAFER

CROSS-REFERENCE TO RELATED APPLICATION

This application claims the priority benefit of Taiwan application serial no. 108138034, filed on Oct. 22, 2019. The entirety of the above-mentioned patent application is hereby incorporated by reference herein and made a part of this specification.

BACKGROUND

Field of the Invention

The invention relates to a light emitting diode structure and more particularly, to a micro light emitting diode chip and a micro light emitting diode wafer.

Description of Related Art

In a conventional technique, a light emitting layer usually adopts a multiple quantum well design. A material of the quantum well layer in the light emitting layer is usually indium gallium nitride (InGaN), and a material of a barrier layer in the light emitting layer is usually gallium nitride (GaN). When an indium doping concentration of the quantum well layer is increased, a wavelength of light emitted by the light emitting layer is increased as well. On the contrary, when the indium doping concentration of the quantum well layer is reduced, the wavelength of the light emitted by the light emitting layer is reduced. Therefore, the indium doping concentration in the quantum well layer may be regulated to adjust the wavelength of the light emitted by the light emitting layer, such as blue light or green light. Thus, how to regulate the indium doping concentration in the quantum well layer has become one of the important subjects to be studied at present.

SUMMARY

The invention provides a micro light emitting diode chip capable of controlling an aggregation of a metal element though the disposition of non-epitaxial media.

The invention provides a micro light emitting diode wafer simultaneously having a light emitting layer that may emit different color lights.

A micro light emitting diode chip of the invention includes a light emitting layer, a first type semiconductor layer and a second type semiconductor layer. The light emitting layer includes a metal element and a plurality of non-epitaxial media. The non-epitaxial media are separated from each other to disperse the metal element. A spacing between any two adjacent non-epitaxial media is less than 100 nanometers. The first type semiconductor layer is disposed on one side of the light emitting layer. The second type semiconductor layer is disposed on the other side of the light emitting layer.

In an embodiment of the invention, a thickness of the micro light emitting diode chip is less than 10 μm and a width of the micro light emitting diode chip is less than 100 μm.

In an embodiment of the invention, a material of the non-epitaxial media includes silicon dioxide, silicon nitride or a metal oxide, and the non-epitaxial media are a plurality of insulation patterns.

In an embodiment of the invention, in a cross-sectional view, a shape of the insulation patterns includes a rectangular shape, a semicircular shape, a semi-elliptical shape, a trapezoidal shape or a combination of the shapes.

In an embodiment of the invention, the non-epitaxial media are air.

In an embodiment of the invention, the first-type semiconductor layer is a P-type semiconductor layer, the second-type semiconductor layer is an N-type semiconductor layer, the second-type semiconductor layer has a plurality of grooves, and the grooves respectively correspond to the non-epitaxial media.

In an embodiment of the invention, each of the grooves has a rough surface.

In an embodiment of the invention, the metal element is indium.

In an embodiment of the invention, a chemical formula of the light emitting layer is $In_xGa_{1-x}N$, and x ranges between 0.23 and 0.31, or ranges between 0.38 and 0.44.

A micro light emitting diode wafer includes a light emitting layer, a first type semiconductor layer and a second type semiconductor layer. The light emitting layer includes a metal element and a plurality of non-epitaxial media. The non-epitaxial media are separated from each other to disperse the metal element. In a first region and a second region adjacent to each other, the non-epitaxial media within the first region are arranged with a first pitch. The non-epitaxial media within the second region are arranged with a second pitch. The second pitch is greater than the first pitch. A spacing between any two adjacent non-epitaxial media is less than 100 nanometers. The first type semiconductor layer is disposed on one side of the light emitting layer. The second type semiconductor layer is disposed on the other side of the light emitting layer.

In an embodiment of the invention, the light emitting layer emits first color light within the first region and the light emitting layer emits second color light within the second region. A wavelength of the first color light is smaller than the wavelength of the second color light.

In an embodiment of the invention, a material of the non-epitaxial media includes silicon dioxide, silicon nitride or a metal oxide, and the non-epitaxial media are a plurality of insulation patterns.

In an embodiment of the invention, in a cross-sectional view, a shape of the insulation patterns includes a rectangular shape, a semicircular shape, a semi-elliptical shape, a trapezoidal shape or a combination of the shapes.

In an embodiment of the invention, the non-epitaxial media are air.

In an embodiment of the invention, the first-type semiconductor layer is a P-type semiconductor layer, the second-type semiconductor layer is an N-type semiconductor layer, the second-type semiconductor layer has a plurality of grooves, and the grooves respectively correspond to the non-epitaxial media.

In an embodiment of the invention, each of the grooves has a rough surface.

In an embodiment of the invention, the metal element is indium.

In an embodiment of the invention, a chemical formula of the light emitting layer is $In_xGa_{1-x}N$, and x ranges 0.23 and 0.31 and ranges between 0.38 and 0.44.

Based on the above, in the design of the invention, the light emitting layer includes the metal element and the non-epitaxial media, wherein the non-epitaxial media are separated from each other to disperse the metal element, and the spacing between any two adjacent non-epitaxial media is less than 100 nanometers. The aggregation of the metal element is controlled through the arrangement of non-epitaxial media, thereby adjusting the color lights emitted by the light emitting layer. In addition, in the micro light emitting diode wafer of the invention, the non-epitaxial media have different pitches in different regions of the light emitting layer, such that the light emitting layer can simultaneously have different color lights. Thus, micro light emitting diode chips having different color lights can be obtained on the micro light emitting diode wafer which can achieve an improved production capacity.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
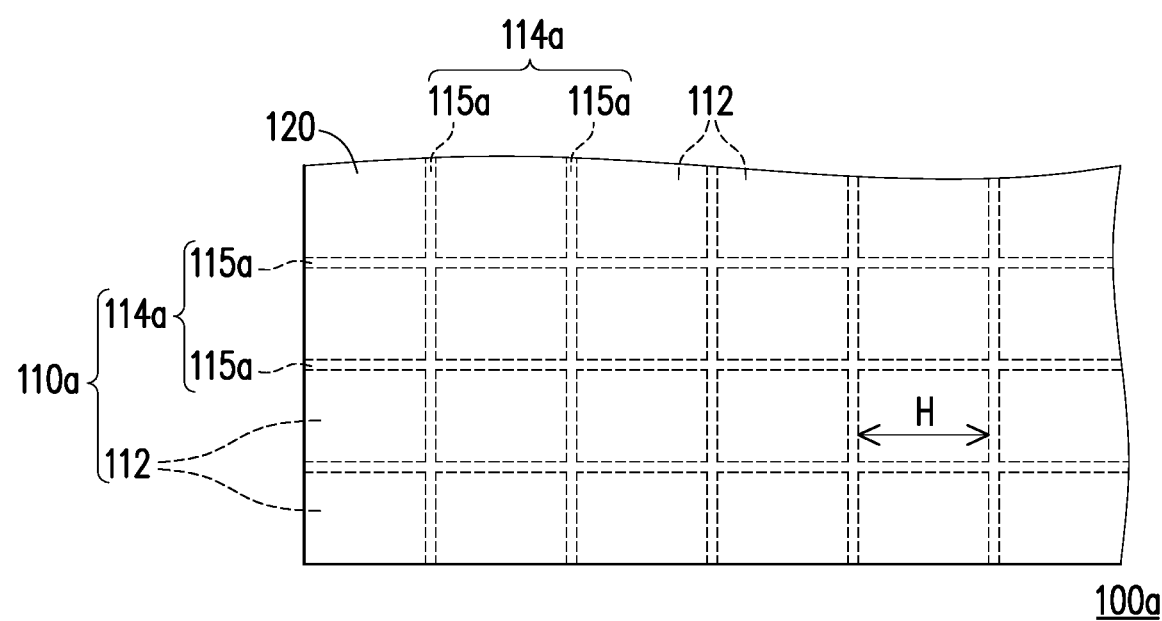
FIG. 1A is a schematic top view of a micro light emitting diode chip according to an embodiment of the invention.
Figure 1B:
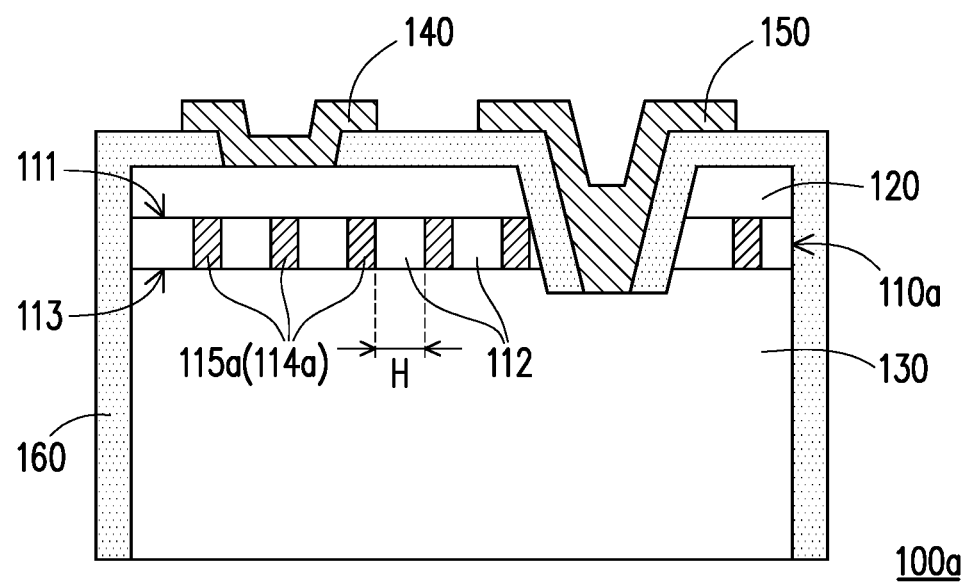
FIG. 1B is a cross-sectional view of the micro light emitting diode chip of FIG. 1A.

FIG. 1A is a schematic top view of a micro light emitting diode chip according to an embodiment of the invention. FIG. 1B is a cross-sectional view of the micro light emitting diode chip of FIG. 1A. Referring to FIG. 1A and FIG. 1B simultaneously, a micro light emitting diode chip 100a includes a light emitting layer 110a, a first type semiconductor layer 120 and a second type semiconductor layer 130. The first type semiconductor layer 120 is disposed on one side 111 of the light emitting layer 110a, and the second type semiconductor layer 130 is disposed on the other side 113 of the light emitting layer 110a. Namely, the first-type semiconductor layer 120 and the second type semiconductor layer 130 are respectively disposed on two opposite sides 113 of the light emitting layer 110a. In this case, the first-type semiconductor layer 120 is, for example, a P-type semiconductor layer, and the second-type semiconductor layer 130 is, for example, an N-type semiconductor layer.

In detail, the light emitting layer 110a of the present embodiment includes a quantum well layer 112 and a plurality of non-epitaxial media 114a, wherein the quantum well layer has a metal element. The non-epitaxial media 114a are separated from each other to disperse the metal element to control an aggregation degree of the metal element. Preferably, a spacing H between any two adjacent non-epitaxial media 114a is less than 100 nanometers. In this case, a chemical formula of the light emitting layer 110a is $In_xGa_{1-x}N$, wherein x represents an element mole fraction, x ranges between 0.23 and 0.31 or alternatively, ranges between 0.38 and 0.44, and the metal element is indium. When x ranges between 0.23 and 0.31, the light emitting layer 110a may emit blue light, and when x ranges between 0.38 and 0.44, the light emitting layer 110a may emit green light.

Specially, a material of the non-epitaxial media 114a of the present embodiment includes, for example, silicon dioxide, silicon nitride or a metal oxide, and the non-epitaxial media 114a are a plurality of insulation patterns 115a. As illustrated in FIG. 1A, in a top view, the insulation patterns 115a present strips and are arranged in a latticed shape, but the invention is not limited thereto. On the other hand, as illustrated in FIG. 1B, in a cross-sectional view, the insulation patterns 115a are arranged in equal pitches (i.e., in the spacings H), and a shape of the holding structure 115a is, for example, a rectangular shape. The insulation patterns 115a are disposed to aim at dispersing the metal element to control the aggregation of the metal element, and the aggregation of the metal element may influence a wavelength of the light emitted by the light emitting layer 110a.

For example, when the pitch between any two adjacent insulation patterns 115a is increased, the metal element in the light emitting layer 110a is more aggregated (i.e., occupies a larger range), and the light emitting layer 110a may emit the green light. Otherwise, when the pitch between any two adjacent insulation patterns 115a is reduced, the metal element in the light emitting layer 110a is less aggregated (i.e., occupies a smaller range), and the light emitting layer 110a may emit the blue light. In other words, through the disposition of the insulation patterns 115a, a uniformity of the wavelength on a wafer may be controlled, or even the aggregation of the metal element in the light emitting layer 340 may be regulated. As such, the micro light emitting diode chip 100a with at least one color light is epitaxially formed.

Specifically, in the present embodiment, after the second-type semiconductor layer 130 is epitaxially formed, the insulation patterns 115a are manufactured on a surface of the second-type semiconductor layer 130. Then, an epitaxy process of the light emitting layer 110a and the first-type semiconductor layer 120 is further performed, and a relatively planar surface of the first-type semiconductor layer 120 is formed. Thereafter, a subsequent process, such as the manufacturing of an insulation passivation layer 160, an electrode layer (i.e., including the first-type electrode 140 and the second-type electrode 150 is further performed.

In brief, in the design of the micro light emitting diode chip 100a of the present embodiment, the light emitting layer 110a includes the metal element and the non-epitaxial media 114a, wherein the non-epitaxial media 114a are separated from each other to disperse the metal element, and the spacing H between any two adjacent non-epitaxial media 114a is less than 100 nanometers. The aggregation of the metal element is controlled through the arrangement of the non-epitaxial media 114a, thereby adjusting the color light emitted by the light emitting layer 110a. The micro light diode chip 100a of the present invention refers to an LED chip separated from an epitaxial substrate, and a thickness of the micro light emitting diode chip is less than 10 μm and a width of the micro light emitting diode chip is less than 100 μm.

It should be noted that the reference numerals and a part of the contents in the previous embodiment are used in the following embodiments, in which identical reference numerals indicate identical or similar components, and repeated description of the same technical contents is omitted. The description related to the omitted parts can be found in the previous embodiment, and no repeated description is contained in the following embodiments.

Figure 2A:
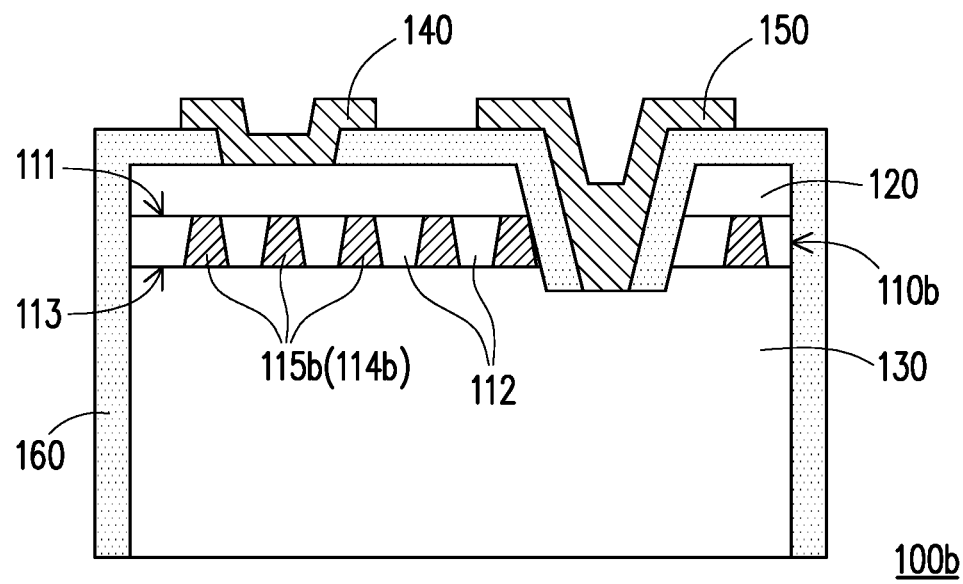
FIG. 2A is a schematic cross-sectional view of a micro light emitting diode chip according to an embodiment of the invention.

FIG. 2A is a schematic cross-sectional view of a micro light emitting diode chip according to an embodiment of the invention. Referring to FIG. 1B and FIG. 2A simultaneously, a micro light emitting diode chip 100b of the present embodiment is similar to the micro light emitting diode chip 100a illustrated in FIG. 1B, and a difference therebetween is as follows. Non-epitaxial media 114b of a light emitting layer 110b of the present embodiment includes a plurality of insulation patterns 115b, and in a cross-sectional view, a shape of the insulation patterns 115b is embodied in an upright-trapezoidal shape.

Figure 2B:
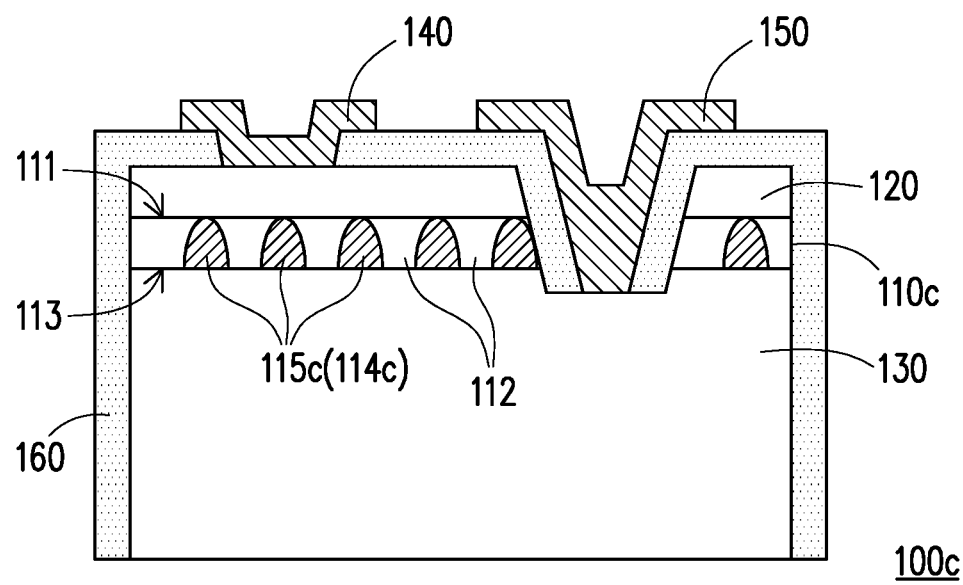
FIG. 2B is a schematic cross-sectional view of a micro light emitting diode chip according to another embodiment of the invention.

FIG. 2B is a schematic cross-sectional view of a micro light emitting diode chip according to another embodiment of the invention. Referring to FIG. 1B and FIG. 2B simultaneously, a micro light emitting diode chip 100c of the present embodiment is similar to the micro light emitting diode chip 100a illustrated in FIG. 1B, and a difference therebetween is as follows. Non-epitaxial media 114c of a light emitting layer 110c of the present embodiment include a plurality of insulation patterns 115c, and in a cross-sectional view, a shape of the insulation patterns 115c is embodied in a semi-elliptical shape.

It is to be mentioned that in other embodiments that are not shown, in a cross-sectional view, a shape of the insulation patterns may also be a semicircular shape or alternatively, a combination of any two of the rectangular shape, the semicircular shape, the semi-elliptical shape and the trapezoidal shape, which still falls within the scope sought for protection by the invention.

Figure 2C:
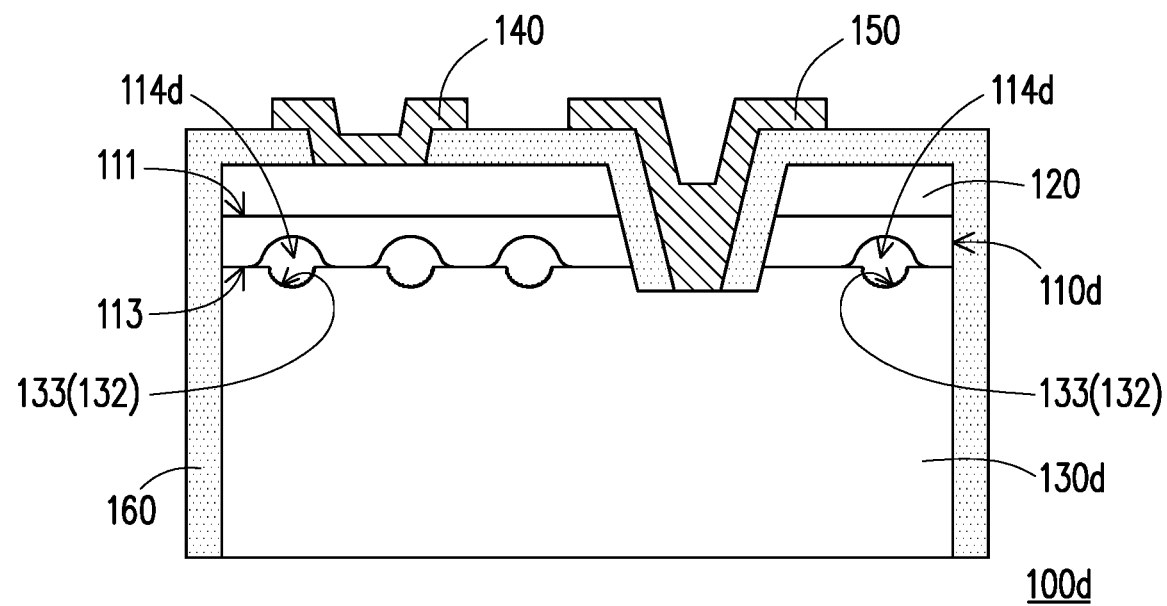
FIG. 2C is a schematic cross-sectional view of a micro light emitting diode chip according to yet another embodiment of the invention.

FIG. 2C is a schematic cross-sectional view of a micro light emitting diode chip according to yet another embodiment of the invention. Referring to FIG. 1B and FIG. 2C, a micro light emitting diode chip 100d of the present embodiment is similar to the micro light emitting diode chip 100a illustrated in FIG. 1B, and a difference therebetween is as follows. Non-epitaxial media 114d of the light emitting layer 110d of the present embodiment are embodied as air. Specifically, a second-type semiconductor layer 130d of the present embodiment has a plurality of grooves 132 adjacent to the light emitting layer 110d, and the grooves 132 respectively correspond to the non-epitaxial media 114d. In this case, each of the grooves 132 has a rough surface 133, and the grooves 132 are formed by laser beam, for example. As such, a subsequent light emitting layer fails to be successfully filmed due to a lattice damage occurring to a surface of an epitaxy layer, but the invention is not limited thereto.

Since the second-type semiconductor layer 130d of the present embodiment is designed with the grooves 132, during the epitaxy process, it is not easy for the light emitting layer 110d to be filmed at the grooves 132, such that air gaps (i.e., the non-epitaxial media 114d) are formed in the light emitting layer 110d corresponding to the grooves. In other words, through the arrangement of the grooves 132, the aggregation of the metal element may also be controlled, thereby adjusting the color light emitted by the light emitting layer 110d.

Figure 3A:
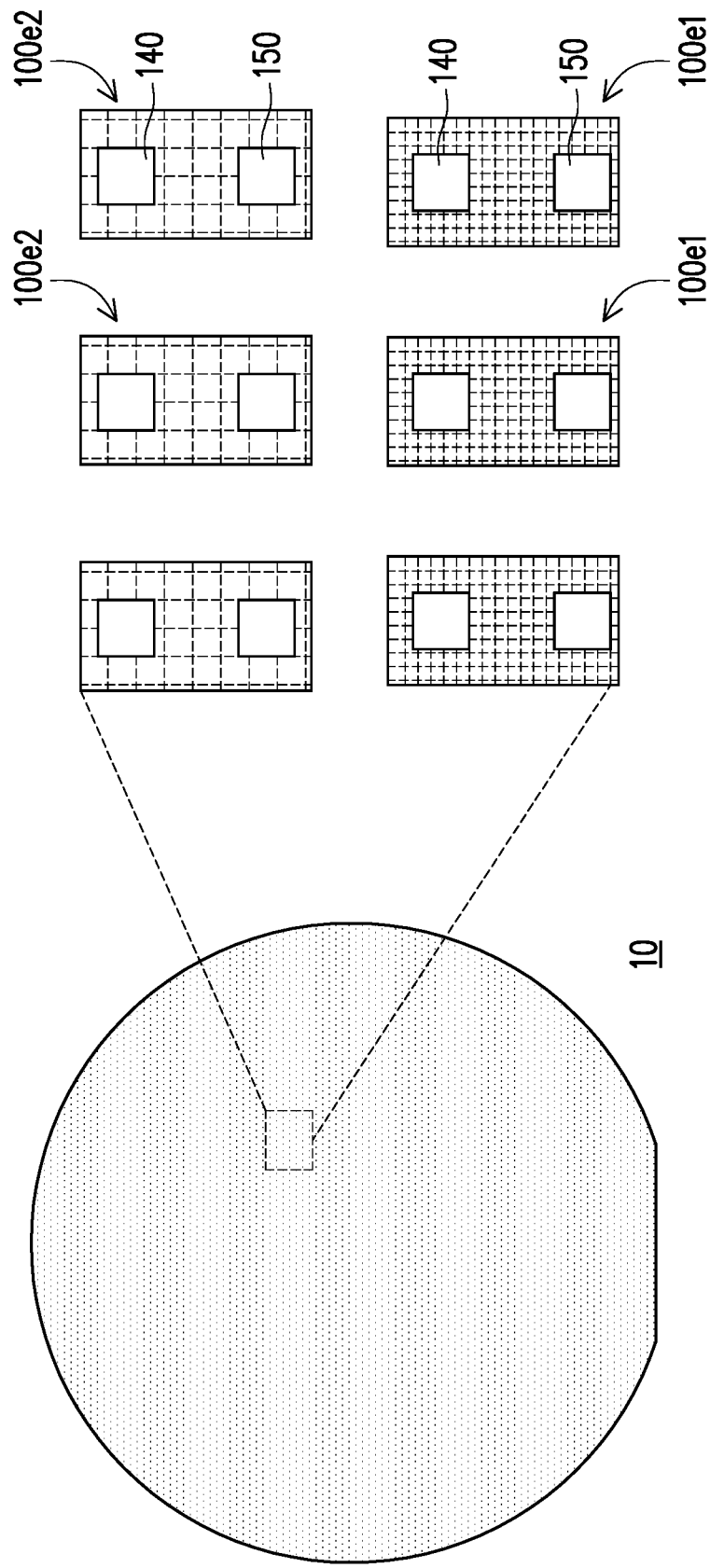
FIG. 3A is a schematic top view of a micro light emitting diode wafer according to an embodiment of the invention.
Figure 3B:
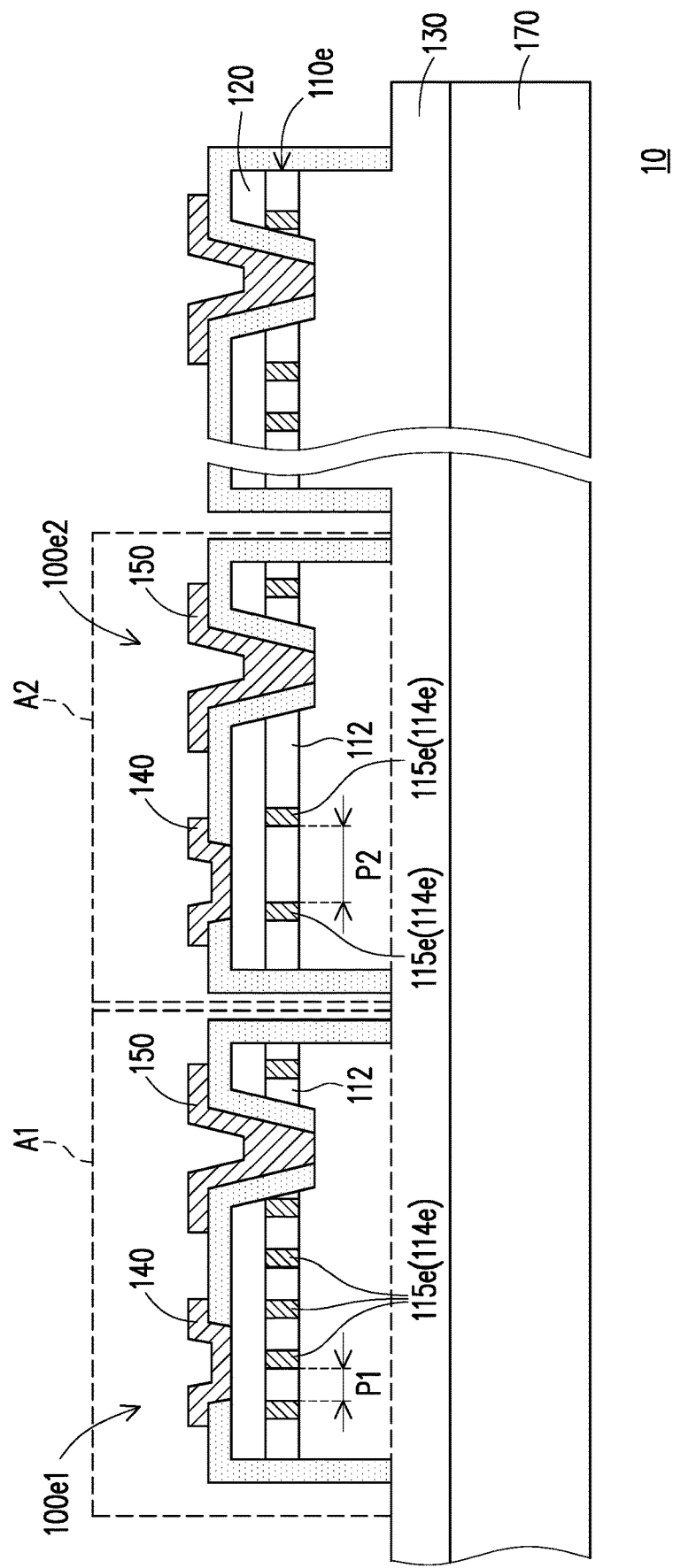
FIG. 3B is a cross-sectional view of the micro light emitting diode wafer of FIG. 3A.

FIG. 3A is a schematic top view of a micro light emitting diode wafer according to an embodiment of the invention. FIG. 3B is a cross-sectional view of the micro light emitting diode wafer of FIG. 3A. Referring to FIG. 3A and FIG. 3B simultaneously, non-epitaxial media 114e of a light emitting layer 110e of a micro light emitting diode wafer 10 of the present embodiment includes a plurality of insulation patterns 115e with at least two pitches, and in a cross-sectional view, a shape of the insulation patterns 115e is embodied in a rectangular shape. Furthermore, in a first region A1 and a second region A2, the non-epitaxial media 114e within the first region A1 are arranged with a first pitch P1. The non-epitaxial media 114e within the second region A2 are arranged with a second pitch P2. Specifically, the second pitch P2 is greater than the first pitch P1.

In this case, a chemical formula of the light emitting layer 110e is $In_xGa_{1-x}N$, wherein x represents an element mole fraction, and x ranges 0.23 and 0.31 and ranges between 0.38 and 0.44, and the metal element is indium. Within the first region A1, x ranges between 0.23 and 0.31, and thus, the light emitting layer 110e may generate the blue light within the first region A1. Within the second region A2, x ranges between 0.38 and 0.44, and thus, the light emitting layer 110e may generate the green light within the second region A2. Certainly, in other embodiments that are not shown, a chemical formula of the light emitting layer is $In_xGa_{1-x}N$, wherein x represents an element mole fraction, and x may range between 0.23 and 0.31, or alternatively, may range between 0.38 and 0.44, which still falls within the scope sought for protection by the invention.

In the present embodiment, a second type semiconductor layer 130 is formed on a substrate 170, and an overall light emitting layer 110e is manufactured on the second type semiconductor layer 130. Then, quantum well layers 112 with different widths are defined by the plurality of insulation patterns 115e. Thereafter, the concentrations and aggregation of a metal element (indium) in the quantum well layers 112 is reset to have different distributions respectively in the first region A1 and the second region A2 by an annealing process and to form the light emitting layer 10e with different light emitting wavelengths.

In brief, the micro light emitting diode wafer 10 of the present embodiment may epitaxially form the light emitting layers 110e with the blue light and the green light, and thus, in a subsequent etching process, blue light emitting diode chips 100e1 and green light emitting diode chips 100e2 may be formed at first regions A1 and the second regions A2, thereby achieving an improved production capacity.

Based on the above, in the design of the invention, the light emitting layer includes the metal element and the non-epitaxial media, wherein the non-epitaxial media are separated from each other to disperse the metal element, and the spacing between any two adjacent non-epitaxial media is less than 100 nanometers. The aggregation of the metal element is controlled through the arrangement of the non-epitaxial media (e.g., silicon dioxide insulation blocks or air), thereby adjusting the color light emitted by the light emitting layer. In addition, in the micro light emitting diode wafer of the invention, the non-epitaxial media have different pitches in different regions of the light emitting layer, such that the light emitting layer can simultaneously have different color lights. Therefore, micro light emitting diode chips having different color lights can be manufactured on the micro light emitting diode wafer which can achieve an improved production capacity.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A micro light emitting diode wafer, comprising:
a light emitting layer, comprising a metal element and a plurality of non-epitaxial media, wherein the non-epitaxial media are separated from each other to disperse the metal element, wherein in a first region and a second region adjacent to each other, the non-epitaxial media within the first region are arranged with a first pitch, the non-epitaxial media within the second region are arranged with a second pitch, the second pitch is greater than the first pitch, and a spacing between any two adjacent non-epitaxial media is less than 100 nanometers,
wherein the light emitting layer emits first color light within the first region, the light emitting layer emits second color light within the second region, and a wavelength of the first color light is different from the wavelength of the second color light;
a substrate;
a first type semiconductor layer, disposed on one side of the light emitting layer; and
a second type semiconductor layer, having two sides opposite to each other, wherein one of the two sides of the second type semiconductor layer is formed on the substrate, and the other one of the two sides of the second type semiconductor layer is disposed on the other side of the light emitting layer, the first region and the second region are located on the second type semiconductor layer simultaneously, the metal element, the first type semiconductor layer, and the second type semiconductor layer are epitaxial layers, and the epitaxial layers epitaxially form on the substrate.

2. The micro light emitting diode wafer according to claim 1, wherein the light emitting layer emits the first color light within the first region, the light emitting layer emits the second color light within the second region, and the wavelength of the first color light is smaller than the wavelength of the second color light.

3. The micro light emitting diode wafer according to claim 1, wherein a material of the non-epitaxial media comprises silicon dioxide, silicon nitride or a metal oxide, and the non-epitaxial media are a plurality of insulation patterns.

4. The micro light emitting diode wafer according to claim 3, wherein in a cross-sectional view, a shape of the insulation patterns comprises a rectangular shape, a semi-circular shape, a semi-elliptical shape, a trapezoidal shape or a combination of the shapes.

5. The micro light emitting diode wafer according to claim 1, wherein the non-epitaxial media are air.

6. The micro light emitting diode wafer according to claim 5, wherein the first-type semiconductor layer is a P-type semiconductor layer, the second-type semiconductor layer is an N-type semiconductor layer, the second-type semiconductor layer has a plurality of grooves, and the grooves respectively correspond to the non-epitaxial media.

7. The micro light emitting diode wafer according to claim 6, wherein each of the grooves has a rough surface.

8. The micro light emitting diode wafer according to claim 1, wherein the metal element is indium.

9. The micro light emitting diode wafer according to claim 1, wherein a chemical formula of the light emitting layer is $In_xGa_{1-x}N$, x ranges between 0.23 and 0.31 and ranges between 0.38 and 0.44.

* * * * *